US011101270B2

(12) United States Patent
Pillarisetty et al.

(10) Patent No.: US 11,101,270 B2
(45) Date of Patent: Aug. 24, 2021

(54) TECHNIQUES AND MECHANISMS FOR OPERATION OF STACKED TRANSISTORS

(71) Applicant: Intel Corporation, Santa Clara, CA (US)

(72) Inventors: Ravi Pillarisetty, Portland, OR (US); Willy Rachmady, Beaverton, OR (US); Marko Radosavljevic, Portland, OR (US); Van H. Le, Portland, OR (US); Jack T. Kavalieros, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/606,702

(22) PCT Filed: Jun. 29, 2017

(86) PCT No.: PCT/US2017/039947
§ 371 (c)(1),
(2) Date: Oct. 18, 2019

(87) PCT Pub. No.: WO2019/005061
PCT Pub. Date: Jan. 3, 2019

(65) Prior Publication Data
US 2020/0098754 A1    Mar. 26, 2020

(51) Int. Cl.
*H01L 27/092*    (2006.01)
*H01L 21/822*    (2006.01)
*H01L 21/8238*    (2006.01)

(52) U.S. Cl.
CPC ...... *H01L 27/0922* (2013.01); *H01L 21/8221* (2013.01); *H01L 21/823807* (2013.01);
(Continued)

(58) Field of Classification Search
CPC ............ H01L 27/0922; H01L 21/8221; H01L 21/823807; H01L 21/823842; H01L 21/823871
See application file for complete search history.

(56) References Cited

U.S. PATENT DOCUMENTS 5,612,563 A    3/1997    Fitch et al.
8,809,853 B2    8/2014    Saito et al.
(Continued)

FOREIGN PATENT DOCUMENTS

JP    5898527 B2    4/2016

OTHER PUBLICATIONS

International Preliminary Report on Patentability for International Patent Application No. PCT/US2017/039947, dated Jan. 9, 2020, 9 pages.
(Continued)

*Primary Examiner* — Marc Anthony Armand
(74) *Attorney, Agent, or Firm* — Schwabe, Williamson & Wyatt, P.C.

(57) ABSTRACT

Techniques and mechanisms for operating transistors that are in a stacked configuration. In an embodiment, an integrated circuit (IC) device includes transistors arranged along a line of direction which is orthogonal to a surface of a semiconductor substrate. A first epitaxial structure and a second epitaxial structure are coupled, respectively, to a first channel structure of a first transistor and a second channel structure of a second transistor. The first epitaxial structure and the second epitaxial structure are at different respective levels relative to the surface of the semiconductor substrate. A dielectric material is disposed between the first epitaxial structure and the second epitaxial structure to facilitate electrical insulation of the channels from each other. In another embodiment, the stacked transistors are coupled to
(Continued)

provide a complementary metal-oxide-semiconductor (CMOS) inverter circuit.

15 Claims, 10 Drawing Sheets

(52) U.S. Cl.
CPC ............... *H01L 21/823842* (2013.01); *H01L 21/823871* (2013.01)

(56) References Cited

U.S. PATENT DOCUMENTS

| 9,263,260 | B1* | 2/2016 | Basu | H01L 29/0673 |
|---|---|---|---|---|
| 9,559,164 | B2 | 1/2017 | Feng et al. | |
| 9,583,491 | B2 | 2/2017 | Kim et al. | |
| 2013/0279145 | A1* | 10/2013 | Then | H01L 29/205 |
| | | | | 361/820 |
| 2016/0020305 | A1* | 1/2016 | Obradovic | H01L 27/0605 |
| | | | | 257/39 |
| 2016/0118245 | A1 | 4/2016 | Huang et al. | |
| 2016/0211276 | A1* | 7/2016 | Liu | H01L 27/1211 |

OTHER PUBLICATIONS

International Search Report and Written Opinion for International Patent Application No. PCT/US2017/039947 dated Mar. 29, 2018, 13 pgs.

\* cited by examiner

TECHNIQUES AND MECHANISMS FOR OPERATION OF STACKED TRANSISTORS

CROSS-REFERENCE TO RELATED APPLICATION

This patent application is a U.S. National Phase Application under 35 U.S.C. § 371 of International Application No. PCT/US2017/039947, filed Jun. 29, 2017, entitled "TECHNIQUES AND MECHANISMS FOR OPERATION OF STACKED TRANSISTORS," which designates the United States of America, the entire disclosure of which is hereby incorporated by reference in its entirety and for all purposes.

BACKGROUND

1. Technical Field

Embodiments of the present disclosure generally relate to the field of integrated circuits, and more particularly, to techniques and configurations for operating transistors that are arranged in a stacked configuration.

2. Background Art

Integrated circuit (IC) devices including, for example, control circuitry and/or memory devices continue to scale to smaller sizes. The shrinking of IC sizing and/or spacing tends to increase the sensitivity of circuitry to voltage variation, circuit impedances, signal noise and/or other operational characteristics. As a result, there is expected to be an increasing demand for incremental improvements to the form factor and operational characteristics of IC devices such as those including complementary metal-oxide-semiconductor (CMOS) components.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Figure 1:
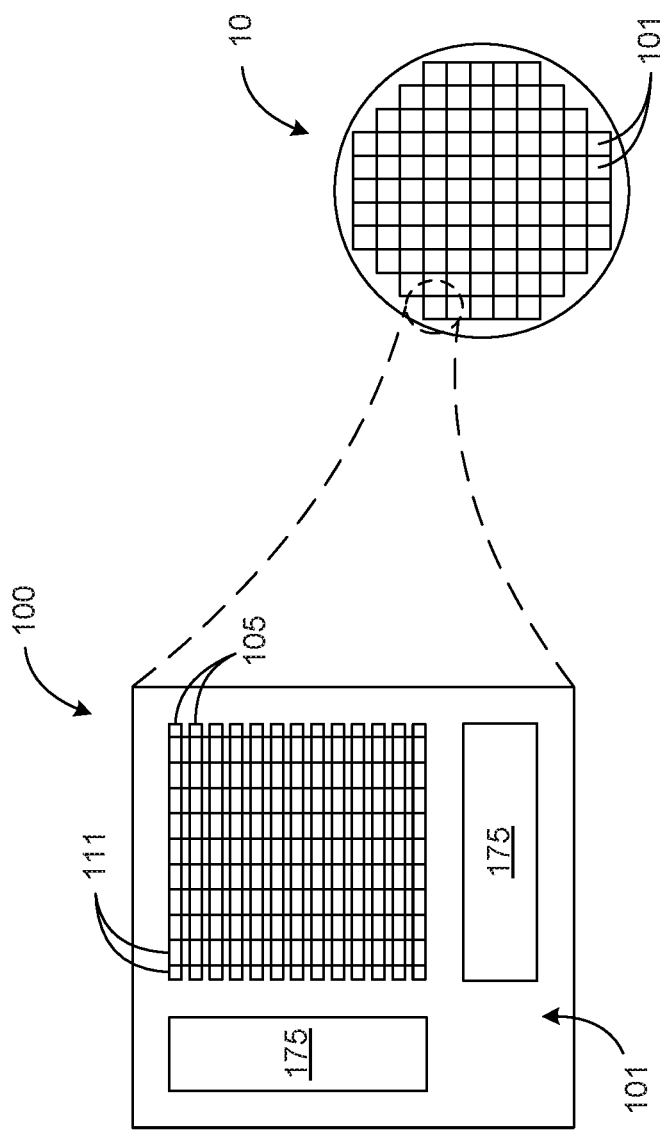
FIG. 1 schematically illustrates a top view of an integrated circuit (IC) device in die form and wafer form, in accordance with some embodiments.

Embodiments of the present disclosure provide techniques and/or mechanisms for operation of stacked transistors of an integrated circuit (IC) device. To illustrate certain features of various embodiments, some techniques and mechanisms are described herein with respect to operation of a complementary metal-oxide-semiconductor (CMOS) inverter circuit which includes a stacked arrangement of an N-type metal-oxide-semiconductor (NMOS) transistor and a P-type metal-oxide-semiconductor (PMOS) transistor. However, such description may be extended to apply to operation of any of a variety of additional or alternative stacked transistor arrangements—e.g., wherein multiple epitaxial structures are disposed at different respective levels relative to the surface of a semiconductor substrate, the multiple epitaxial structures variously coupled to a stacked arrangement of transistors.

The technologies described herein may be implemented in one or more electronic devices. Non-limiting examples of electronic devices that may utilize the technologies described herein include any kind of mobile device and/or stationary device, such as cameras, cell phones, computer terminals, desktop computers, electronic readers, facsimile machines, kiosks, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices including stacked transistors and epitaxial structures disposed at different respective levels along the stacked transistors.

In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations are described as multiple discrete operations in turn, in a manner that is most helpful in understanding the claimed subject matter. However, the order of description should not be construed as to imply that these operations are necessarily order dependent.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, side, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other.

In various embodiments, the phrase "a first layer formed, deposited, or otherwise disposed on a second layer," may mean that the first layer is formed, deposited, or disposed over the second layer, and at least a part of the first layer may be in direct contact (e.g., direct physical and/or electrical contact) or indirect contact (e.g., having one or more other layers between the first layer and the second layer) with at least a part of the second layer.

As used herein, the term "module" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

FIG. 1 schematically illustrates a top view of an IC device 100 in die form and wafer form, in accordance with some embodiments. In some embodiments, the IC device 100 may be one of a plurality of IC devices formed on a wafer 10 composed of semiconductor material. Wafer 10 may include one or more dies (hereinafter "dies 101") formed on a surface of wafer 10. Each of the dies 101 may be a repeating unit of a semiconductor product that includes the IC device 100. After a fabrication process of the semiconductor product is complete, wafer 10 may undergo a singulation process in which each of the dies 101 is separated from one another to provide discrete "chips" of the semiconductor product. Wafer 10 may include a variety of sizes. In some embodiments, wafer 10 has a diameter ranging from about 25.4 mm to about 450 mm. Wafer 10 may include other sizes and/or other shapes in other embodiments.

According to various embodiments, the IC device 100 may be in wafer form (e.g., not singulated) or die form (e.g., singulated). In some embodiments, the IC device 100 may correspond with or be part of a die of the dies 101. In FIG. 1, one of the dies 101 including the IC device 100 is depicted in a detail view. The IC device 100 may include one or more transistors variously included, for example, each in a respective unit cell of a repeating array of unit cells 111, as can be seen. Transistors of the unit cells 111 may, for example, provide an inverter circuit or any of a variety of other circuits which include a stacked arrangement of transistors.

According to various embodiments, one or more transistors may be formed in a stacked three-dimensional (3D) configuration. By way of illustration and not limitation, 3D transistors may be formed using one or more fin structures (e.g., the illustrative fin structures 105 shown) which extend from a surface of a semiconductor substrate. In some embodiments, the fin structures 105 may extend across multiple unit cells 111 of a row or column of unit cells 111, as depicted. In some embodiments, two fin structures of the fin structures 105 are common to unit cells 111 arranged in a row or column. The fin structures 105 may extend across multiple unit cells 111.

The IC device 100 may include additional components and/or elements. For example, in a case where the IC device 100 includes a memory, the IC device 100 may further include select/decode modules 175 to facilitate access transactions (e.g., read/write operations) performed on the storage elements of the memory device. In some embodiments, the IC device 100 can include memory and/or logic devices combined on a single die. For example, a memory device may be formed on a same die 101 as a processor or other logic that is configured to store information in the memory device or execute instructions of the memory device. For example, the IC device 100 may include a processor and cache formed on the same die in some embodiments. Stacked transistor configurations described herein may be incorporated in logic or memory, or combinations thereof.

In some embodiments, the IC device 100 may be a volatile memory device such as a random access memory (RAM). In one embodiment, the IC device 100 may be a static RAM (SRAM) device. However, subject matter of the present disclosure is not limited in this regard and techniques and configurations described herein may be implemented in other types of memory devices and/or integrated circuit (IC) devices that benefit from the principles described herein in other embodiments. For example, in some embodiments, the IC device 100 may be a processor, controller or other module that uses stacked transistors (e.g., of an inverter circuit) as described herein.

The particular configuration of the IC device 100 of FIG. 1 is one example and other configurations may fall within the scope of the present disclosure. For example, the select/decode modules 175 may be positioned in a variety of other suitable configurations relative to the fin structures 105 or may not be included at all and/or the fin structures 105 may extend in other directions in other embodiments.

Figure 2A:
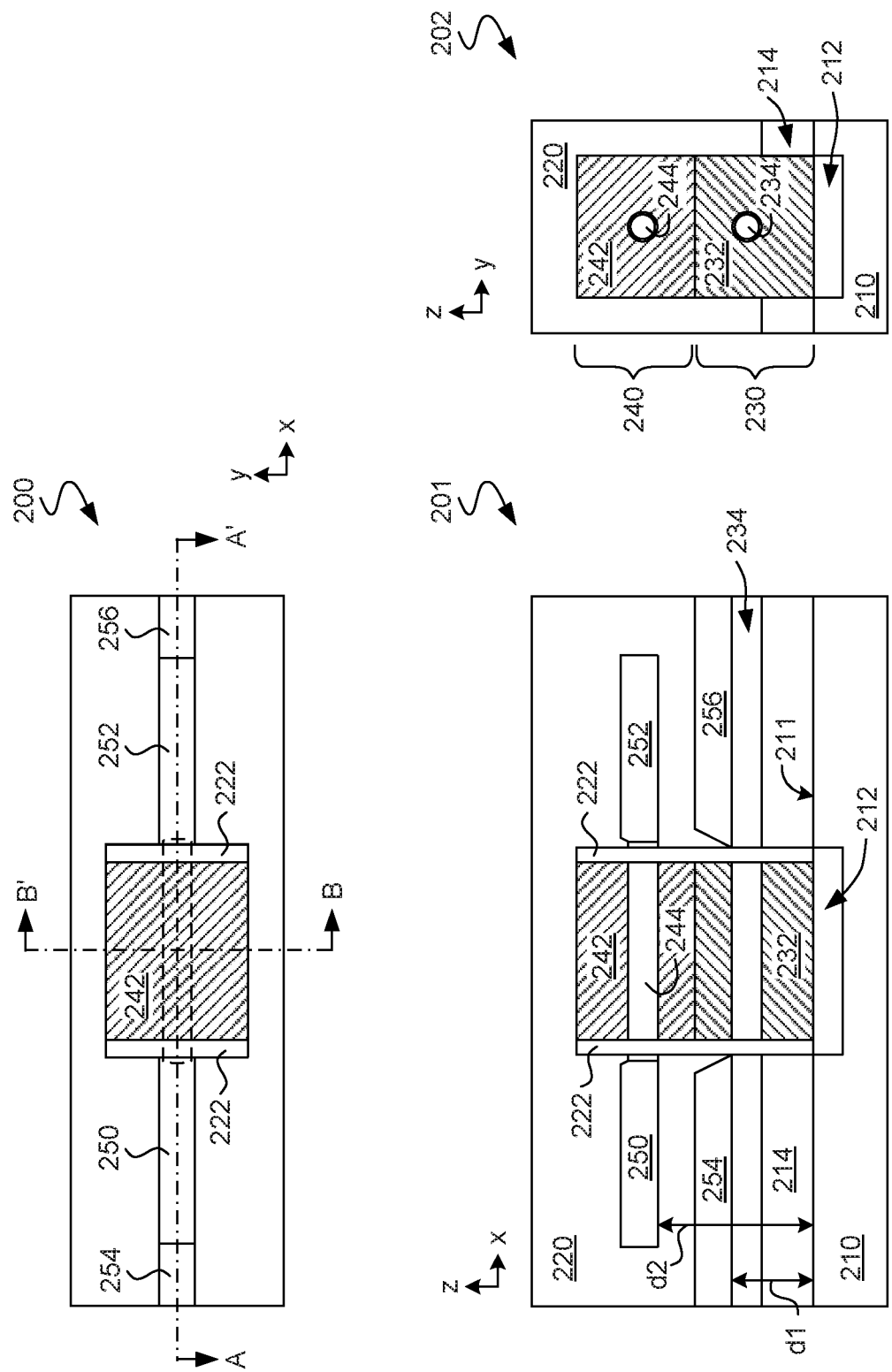
FIGS. 2A, 2B illustrate various views of an IC device to operate stacked transistors in accordance with some embodiments.
Figure 2B:
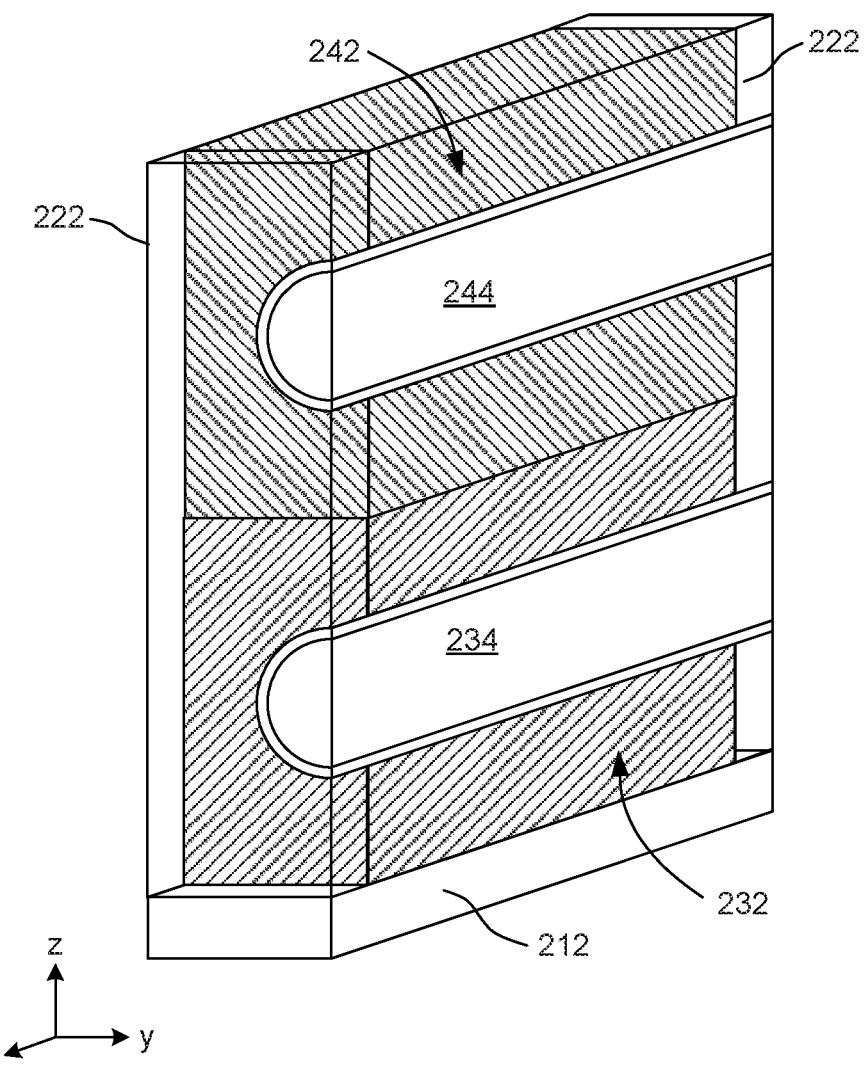

FIGS. 2A, 2B show various views of an integrated circuit (IC) device 200, according to an embodiment, which includes structures to enable operation of stacked transistors. IC device 200 is one example of an embodiment wherein transistors are arranged in a stacked configuration which extends from a semiconductor substrate, wherein a first epitaxial structure (for brevity, also referred to herein as an "epitaxy" or "epi") and a second epitaxial structure are each coupled to a respective one of the transistors at different levels along the stacked configuration. IC device 200 may include features of one of dies 101, for example.

FIG. 2A shows an IC device 200 from a top view, as well as cross-sectional views 201, 202 corresponding to respective cross-sections A-A', B-B' of IC device 200. As variously shown in FIG. 2A, IC device 200 may include a semiconductor substrate 210 and a stacked configuration of transistors 230, 240 extending from semiconductor substrate 210. FIG. 2B shows a cut-away view perspective view 203 of the stacked configuration. IC device 200 may be manufactured by processing which variously deposits, masks, patterns (e.g., etches) or otherwise forms transistors 230, 240 and/or other structure in or on semiconductor substrate 210—e.g., including some processes adapted from conventional semiconductor fabrication techniques.

Substrate 210 may include any of a variety of silicon semiconductor materials that, for example, are used in conventional IC chip manufacturing. In the example embodiment shown, transistor 230 is coupled to substrate 210 via an insulator (e.g., an oxide structure such as the illustrative buried oxide 212 shown), and a layer 214 of silicon germanium (SiGe) is grown or otherwise deposited on substrate 210. Layer 214 may have disposed thereon another layer 234 comprising silicon or other material suitable to provide a channel structure of transistor 230. It will be understood from this disclosure that some embodiments vary with respect to semiconductor materials, insulators and/or other structures that may disposed under, or otherwise coupled to, stacked transistors and epitaxial structures as described herein.

In the example embodiment shown, transistor 230 includes a first channel structure (formed by layer 234) and a gate structure 232 which is to selectively control current flow with the first channel structure. Transistor 230 may include or otherwise form a fin structure on substrate 210—e.g., wherein gate structure 232 extends over a surface 211 of substrate 210 and at least partially around the first channel structure. In some embodiments, the first channel structure may comprise some or all of a nanowire portion which extends through gate structure 232. Such a nanowire may be surrounded by a dielectric film which is disposed between gate structure 232 and the first channel structure.

Alternatively or in addition, transistor 240 may include a channel structure 244 and a gate structure 242 which, for example, have functional characteristics of the first channel structure and gate structure 232, respectively. Electrical insulation of transistors 230, 240 may be facilitated, for example, by standoff structures 222 (e.g., forming a dielectric shell or slabs) disposed on respective sides of the stacked configuration. Gate structures 232, 242 may be directly in contact with one another—e.g., wherein transistors 230, 240 are to be configured for operation as a CMOS inverter. However, other embodiments are not limited in this regard, and the stacked configuration may further comprise one or more other structures disposed between transistors 230, 240.

To facilitate operation of transistors 230, 240, some embodiments provide epi structures at various levels relative to a surface structure (e.g., an interior surface) such as surface 211 of semiconductor substrate 210. The levels may intersect different respective locations along a line of direction—e.g., a z-axis height dimension—which is perpendicular to a surface 211 of semiconductor substrate 210. Some or all such epi structures may be variously coupled each to a respective channel structure of a corresponding transistor of the stacked configuration. For example, two of the epi structures—e.g., each adjoining a different respective channel structure—may have a dielectric material disposed therebetween, to promote electrical insulation of the epi structures (and of their respective channels) from one another. In some embodiments, the two such epi structures may have different respective conductivity types—e.g., wherein one epi structure is p-type and the other epi structure is n-type.

By way of illustration and not limitation, epi structures 254, 256 may be variously disposed on opposite sides of the first channel structure of transistor 230 (wherein the first channel structure includes the portion of layer 234 which extends through gate structure 232). Alternatively or in addition, epi structures 250, 252 may be variously disposed on opposite sides of the channel structure 244 of transistor 240. Epi structures 250, 252 may each be coupled to, or function as, a respective one of a source terminal and a drain terminal of transistor 240—e.g., where epi structures 254, 256 each couple to, or function as, a respective one of a source terminal and a drain terminal of transistor 230. Insulation of the stacked transistors may be further provided with a dielectric 220 (e.g., silicon nitride) which is disposed on epi structures 254, 256. Such a dielectric may be disposed between two epi structures—e.g., between epi structures 250, 254 and/or between epi structures 252, 256.

In such an embodiment, one or both of epi structures 250, 252 may be at a different height, relative to surface 211, than one or both of epi structures 254, 256. For example, within cross-section A-A', epi structure 254 may be at a distance d1 from surface 211 and epi structure 250 may be at a distance d2 from surface 211, wherein the difference (d2−d1) is at least ten percent (and in some embodiments, at least twenty percent) of d1.

Within a given one of the stacked transistors 230, 240, a channel structure (e.g., channel structure 244 or that provided by layer 234) may comprise a group IV, III-V, or II-VI semiconductor material, for example. A gate structure of the transistor (e.g., one of gate structures 232, 242) may include at least one P-type workfunction metal or N-type workfunction metal, depending on whether the transistor is to be a PMOS or an NMOS transistor. For a PMOS transistor, metals that may be used for the gate structure include, but are not limited to, ruthenium, palladium, platinum, cobalt, nickel, and conductive metal oxides, e.g., ruthenium oxide. A P-type metal will enable the formation of a PMOS gate electrode with a workfunction that is between about 4.9 eV and about 5.2 eV. For an NMOS transistor, metals that may be used for the gate structure include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal will enable the formation of an NMOS gate electrode with a workfunction that is between about 3.9 eV and about 4.2 eV.

The channel structure may adjoin (e.g., be surrounded by) a dielectric film which is disposed between the channel structure and the gate structure of the transistor. Such a dielectric film may, for example, comprise at least one of silicon oxide ($SiO_2$), silicon oxynitride ($SiO_xN_y$), silicon nitride ($Si_xN_y$), aluminum oxide ($Al_2O_3$), hafnium oxide ($HfO_2$), hafnium aluminum oxide ($HfAl_xO_y$), hafnium silicon oxide ($HfSi_xO_y$), zirconium oxide ($ZrO_2$), zirconium silicon oxide ($ZrSi_xO_y$), lanthanum oxide ($La_2O_3$), yttrium oxide ($Y_2O_3$), lanthanum aluminum oxide ($LaAl_xO_y$), tantalum oxide ($Ta_2O_5$), titanium oxide ($TiO_2$), barium strontium titanium oxide ($BaSrTi_xO_y$), barium titanium oxide ($BaTi_xO_y$), strontium titanium oxide ($SrTi_xO_y$), lead scandium tantalum oxide ($PbSc_xTa_yO_z$), or lead zinc niobate ($PbZn_xNb_yO_z$), or combinations thereof, where x, y, and z represent suitable quantities of the respective elements. One or more epitaxial structures (e.g., some or all of epi structures 250, 252, 254, 256)—variously coupled each to a respective one of transistors 230, 240—may be formed by molecular beam epitaxy (MBE), atomic layer epitaxy (ALE), epitaxial growth, chemical beam epitaxy (CBE), metal-organic chemical vapor deposition (MOCVD), or combinations thereof.

Figure 3:
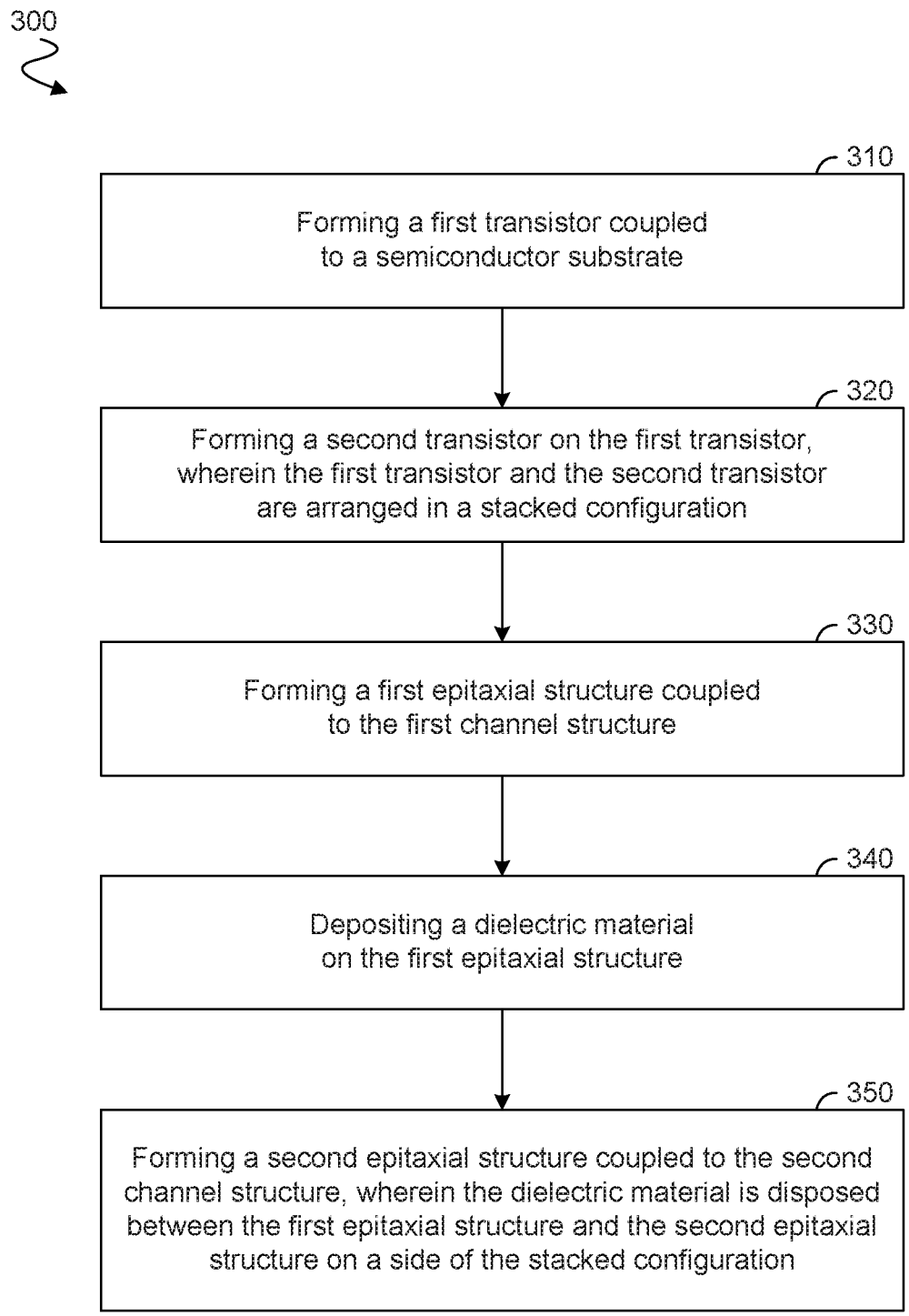
FIG. 3 is a flow diagram illustrating elements of a method to provide functionality of an IC device according to an embodiment.
Figure 4A:
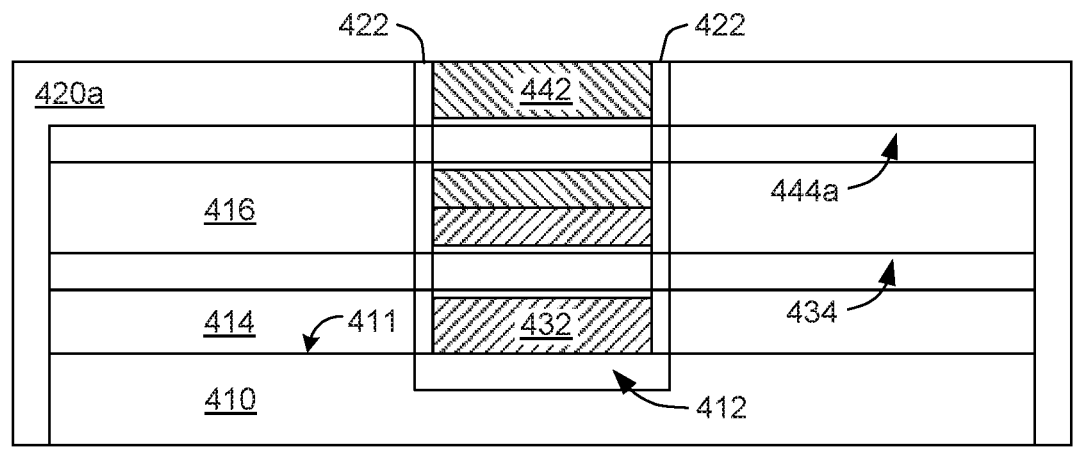
FIGS. 4A-4C show various stages of processing to fabricate IC structures according to an embodiment.
Figure 4A:
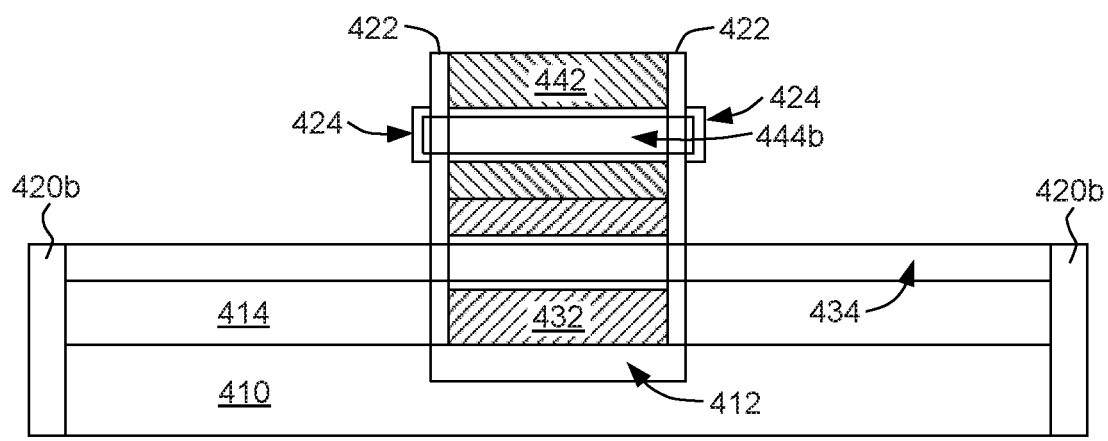
Figure 4B:
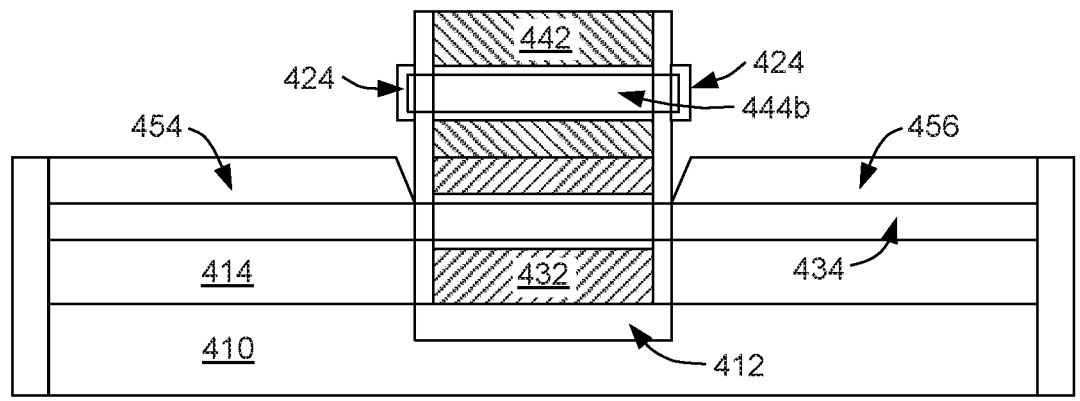
Figure 4B:
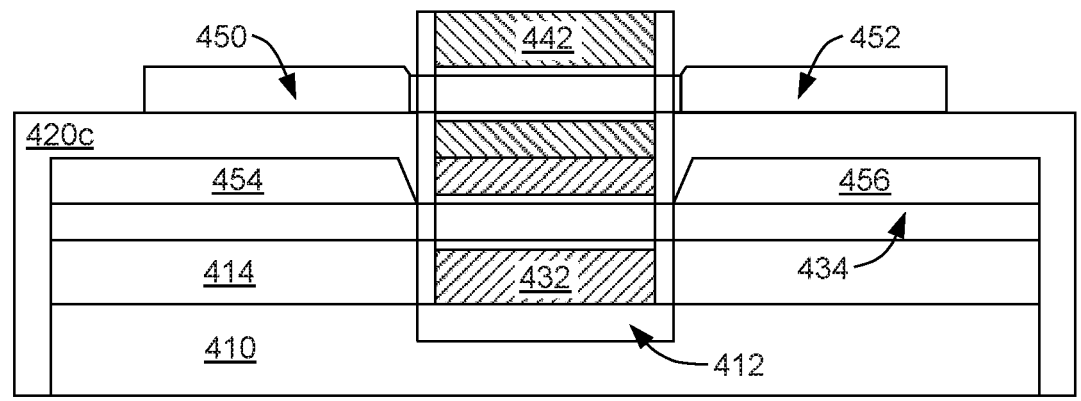

FIG. 3 shows features of a method 300 to provide functionality of an integrated circuit according to an embodiment. Method 300 may include operations to fabricate structures of IC device 200, for example. To illustrate certain features of various embodiments, method 300 is described herein with reference to FIGS. 4A-4C, which show various stages 400-405 of processing to provide integrated circuit structures according to an embodiment. However, method 300 may be performed, in other embodiments, to provide circuit structures other than, or in addition to, those shown in stages 400-405.

Method 300 may include forming a first transistor coupled to a semiconductor substrate (at 310) and forming a second transistor on the first transistor (at 320). The first transistor and the second transistor may be arranged in a stacked configuration along a line of direction orthogonal to a surface (e.g., an interior surface) of the semiconductor substrate. For example, referring now to stage 400 shown in FIG. 4A, a first transistor and a second transistor may be formed in a stacked configuration on a semiconductor substrate 410 (e.g., including the formation of transistors 230, 240, respectively, on substrate 210).

In an embodiment, the first transistor and a second transistor are of different conductivity types. Alternatively or in addition, the first transistor and a second transistor may be indirect contact with each other—e.g., via their respective gate structures. Fabrication of the first transistor and second transistor may include deposition, masking, etching and/or other processes adapted, for example, from conventional 3D transistor fabrication techniques. Such conventional techniques are not detailed herein to avoid obscuring certain features of various embodiments.

The first transistor and second transistor may include respective gate structures 432, 442—e.g., wherein dielectric sidewalls 422 and a buried oxide 412 are to provide at least some insulation of gate structures 432, 442. At stage 400, semiconductor substrate 410 may have disposed thereon successive layers which variously extend around or are otherwise disposed on opposite sides of the first transistor and the second transistor—e.g., wherein at least a portion of the stacked transistors extends along a z-height dimension from a surface 411 of substrate 410. By way of illustration and not limitation, such layers may include a layer 414 of SiGe, a layer 434 of silicon (Si), another layer 416 of SiGe and another layer 444a of Si. Layers 434, 444a may ultimately provide respective channel structures of the first transistor and the second transistor. In some embodiments, a dielectric structure 420a (e.g., comprising silicon nitride or another such insulator material) may be disposed, directly or indirectly, over layer 444a. Portions of layers 434, 444a may variously extend through gate structures 432, 442, respectively—e.g., wherein a dielectric film extends around the portion of layer 434 which is in gate structure 432 and another dielectric film extends around the portion of layer 444a which is in gate structure 442.

In an embodiment, method 300 further comprises, at 330, forming a first epitaxial structure at a first level relative to the surface of the semiconductor substrate, the first epitaxial structure coupled to the first channel structure. For example, referring now to stage 401, etching and/or other subtractive processing may be performed to remove respective portions of dielectric structure 420a, layer 444a and layer 416. This may result in the formation of a channel structure (e.g., the illustrative nanowire 444b shown) from a remaining portion of layer 444a—e.g., where nanowire 444b extends through gate structure 442. Dielectric structures 420b may also be formed from a remaining portion of dielectric structure 420a, although some embodiments are not limited in this regard.

After such subtractive processing, mask structures 424 may be deposited on opposite ends of nanowire 444b. Mask structures 424 may protect nanowire 444b during subsequent processing to grow or otherwise form epitaxial structures which adjoin layer 434. For example, as shown at stage 402, first epi portions 454, 456 may be grown on layer 434 at opposite sides of the stacked configuration. First epi portions 454, 456 may each have a conductivity type which corresponds to the first transistor—e.g., wherein the first transistor is an NMOS device and first epi portions 454, 456 are each an n-type epi structure.

In an embodiment, method 300 further includes depositing a dielectric material on the first epitaxial structure (at 340) and forming, at a second level relative to the surface of the semiconductor substrate, a second epitaxial structure coupled to the second channel structure (at 350). A portion of the dielectric material deposited at 340 may be disposed between the first epitaxial structure and the second epitaxial structure on a side of the stacked configuration. For example, referring now to stage 403, the depositing at 340 may include forming a dielectric structure 420c which extends over one or both of first epi portions 454, 456—e.g., wherein dielectric structure 420c includes additional dielectric material deposited on dielectric structure 420b. After formation of dielectric structure 420c, one or more other epitaxial structures (e.g., including the illustrative second epi portions 450, 452 shown) may be grown or otherwise formed on dielectric structure 420c. For example, mask structures 424 may be removed prior to growth of second epi portions 450, 452, which are subsequently formed each at a different respective end of nanowire 444b. Epi portions 450, 452 may each have a conductivity type which corresponds to the first transistor—e.g., wherein the first transistor is an PMOS device and epi portions 450, 452 are each a p-type epi structure.

Figure 4C:
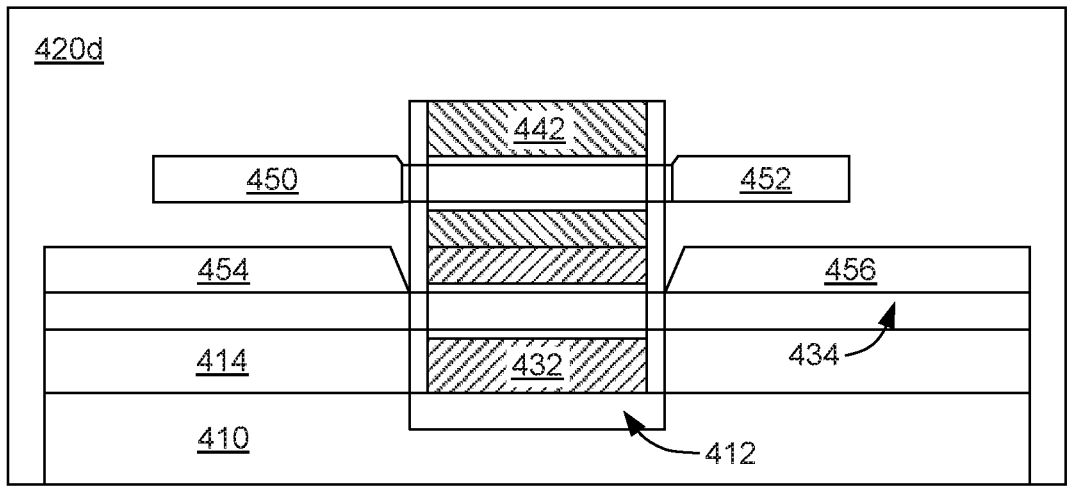
Figure 4C:
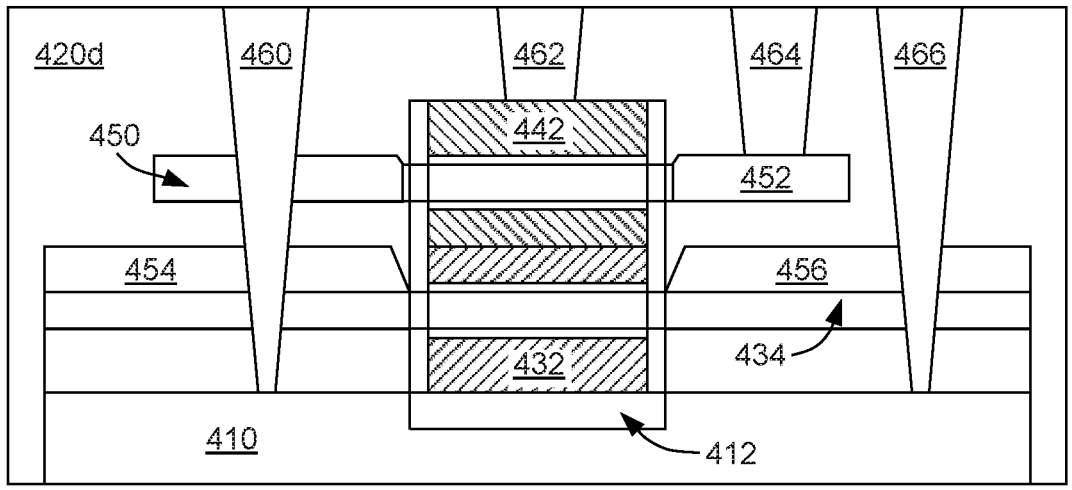

Although some embodiments are not limited in this regard, method 300 may further comprise one or more additional operations (not shown) to configure the stacked configuration of transistors and various epi structures for operation with each other and with additional structure that may be coupled thereto. For example, as shown in FIG. 4C at stage 404, such additional processing may include forming a dielectric structure 420d which extends over one or both of epi portions 450, 452—e.g., wherein dielectric structure 420d also extends above the second transistor. Dielectric structure 420d may include additional dielectric material deposited on dielectric structure 420c, for example.

Referring now to stage 405, one or more via structures—e.g., including the illustrative vias 460, 462, 464, 466 shown—may also be formed to extend into dielectric structure 420d and to variously couple to respective IC structures disposed thereunder. In the example, embodiment shown, via 460 is formed to extend through epi portion 450 and couple to both epi portions 450, 454. Alternatively or in addition, vias 464, 466 may be formed to couple to epi portions 452, 456 respectively—e.g., wherein via 462 is formed to coupled to gate structure 442. In such an embodiment, the first transistor and second transistor may be coupled to provide a CMOS inverter circuit—e.g., wherein via 464 is to provide a supply (Vcc) voltage, via 466 is to provide a reference (Vss) voltage, via 462 is to provide an input signal and via 460 is to provide an output signal from the CMOS inverter. However, stacked transistors may be coupled to any of a variety of additional or alternative arrangements of epi structures and via structures, in different embodiments.

Figure 5:
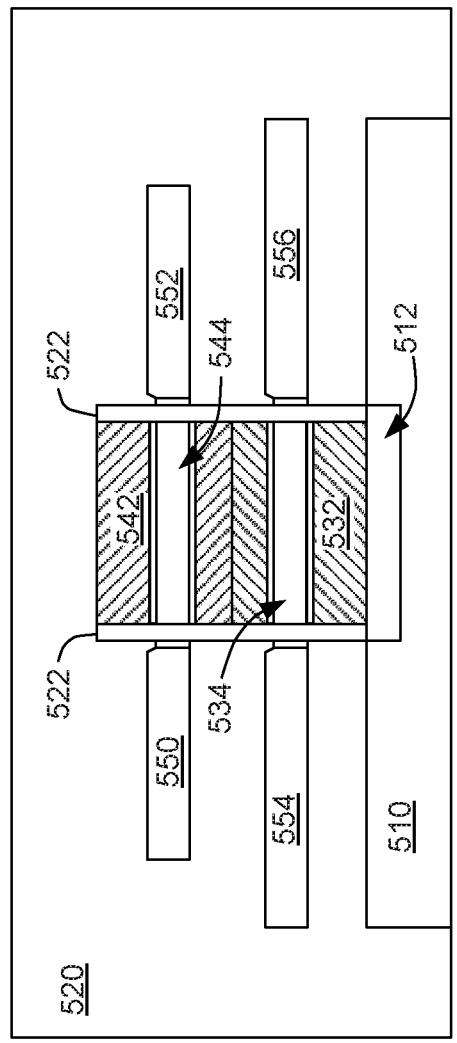
FIG. 5 illustrates features of an IC device to operate stacked transistors in accordance with some embodiments.

FIG. 5 shows an IC device 500 to provide operation of stacked transistors according to another embodiment. IC device 500 may include some features of IC device 200, for example. Alternatively or in addition, structure of IC device 500 may be fabricated according to method 300 and/or processing similar to that shown in stages 400-405.

As shown in FIG. 5, IC device 500 includes a semiconductor substrate 510, a buried oxide 512 and standoff structures 522 which, respectively, may correspond functionally to semiconductor substrate 210, buried oxide 212 and standoff structures 222. IC device 500 may further comprise a first transistor and a second transistor arranged in a stacked configuration on semiconductor substrate 510—e.g., wherein transistors 230, 240, respectively, correspond functionally to the first transistor and second transistor. In the example embodiment shown, the first transistor includes a gate structure 532 and a channel structure 534 (e.g., a nanowire) which extends through gate structure 532. Similarly, the second transistor may include a gate structure 542 and a channel structure 544 (e.g., a nanowire) which extends through gate structure 542. Film structures may each surround a respective one of channel structures 534, 544—e.g., to provide high-k dielectric between channel structure 534 and gate structure 532, as well as between channel structure 544 and gate structure 542. IC device 500 may include any of a variety of other types of transistors arranged in a stacked configuration, in different embodiments.

To facilitate operation of the first transistor and second transistor of IC device 500, some embodiments provide epi structures at various z-height levels relative a surface of semiconductor substrate 510. By way of illustration and not limitation, epi structures 554, 556 may be variously grown or otherwise disposed on opposite ends of channel structure 534. Alternatively or in addition, epi structures 550, 552 may be variously disposed on opposite ends of channel structure 544. Epi structures 550, 552 may each be coupled to, or function as, a respective one of a source terminal and a drain terminal of the second transistor—e.g., where epi structures 554, 556 each couple to, or function as, a respective one of a source terminal and a drain terminal of the first transistor.

Insulation of the stacked transistors may be provided at least in part with a dielectric 520 (e.g., silicon nitride) which is disposed on epi structures 554, 556. Such a dielectric may be disposed between two epi structures—e.g., between epi structures 550, 554 and/or between epi structures 552, 556. IC device 500 is one example of an embodiment wherein stacked transistors each include a respective channel structure, wherein, for each of two or more such channel structures, opposite ends of the channel structure each terminate at a respective epi structure. For example, channel structure 534 may only extend between epi structures 550, 552 along a dimension which is parallel to the surface of substrate 510. Alternatively or in addition, channel structure 544 may only extend between epi structures 554, 556 along such a dimension. Dielectric 520 may extend between epi structures 550, 554 and/or between epi structures 552, 556. In some embodiments, dielectric 520 may extend both above and below each of epi structures 550, 552—e.g., wherein dielectric 520 also extends both above and below each of epi structures 554, 556.

Figure 6:
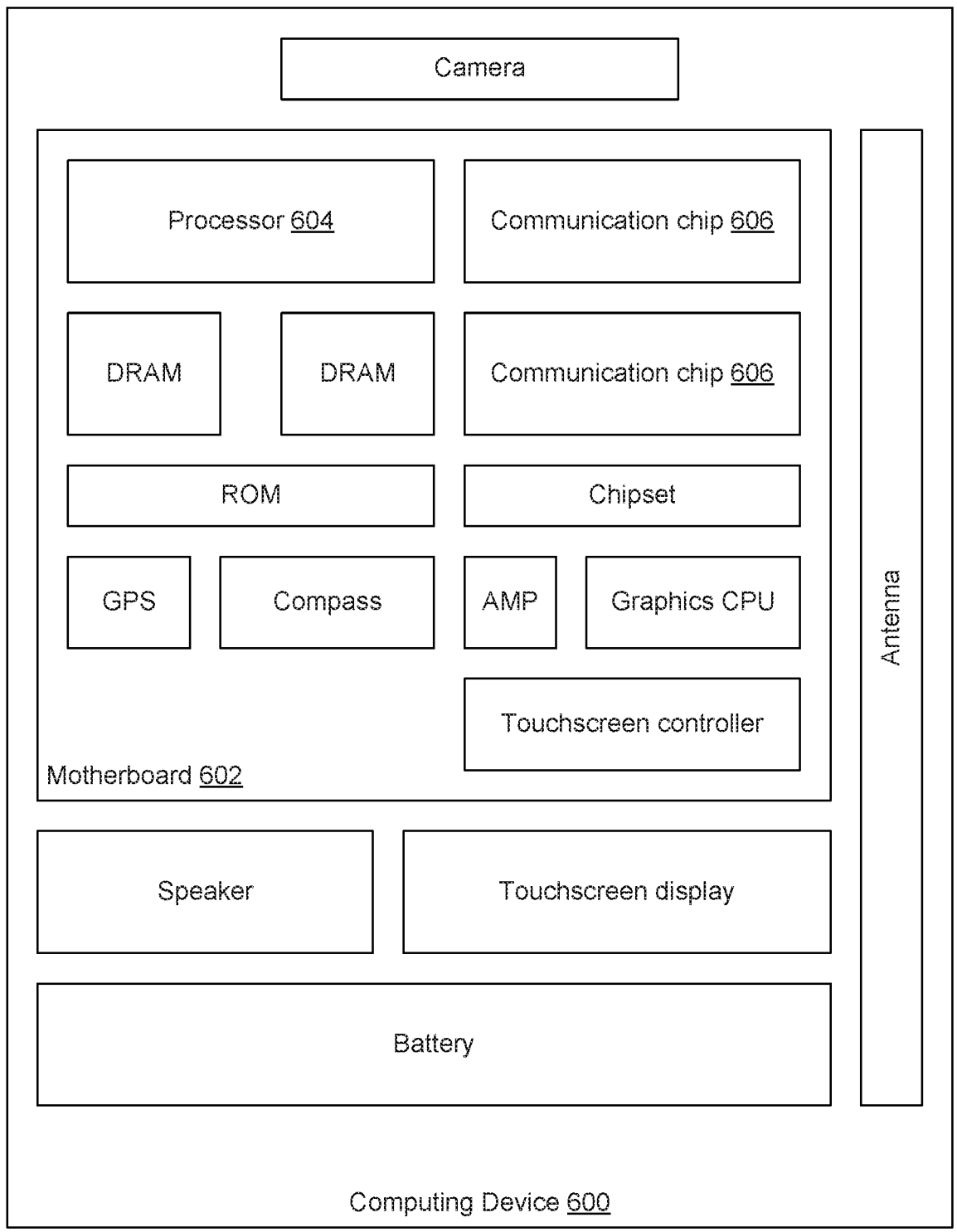
FIG. 6 is a functional block diagram illustrating elements of a computer device according to an embodiment.

FIG. 6 illustrates a computing device 600 in accordance with one embodiment. Computing device 600 is one example of an embodiment which includes IC structures, as described herein, to operate transistors which are arranged in a stacked configuration. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. The term "processor" may refer to any device or portion of a device that processes electronic data from registers and/or memory to transform that electronic data into other electronic data that may be stored in registers and/or memory. The communication chip 606 also includes an integrated circuit die packaged within the communication chip 606.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Some embodiments may be provided as a computer program product, or software, that may include a machine-readable medium having stored thereon instructions, which may be used to program a computer system (or other electronic devices) to perform a process according to an embodiment. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 7:
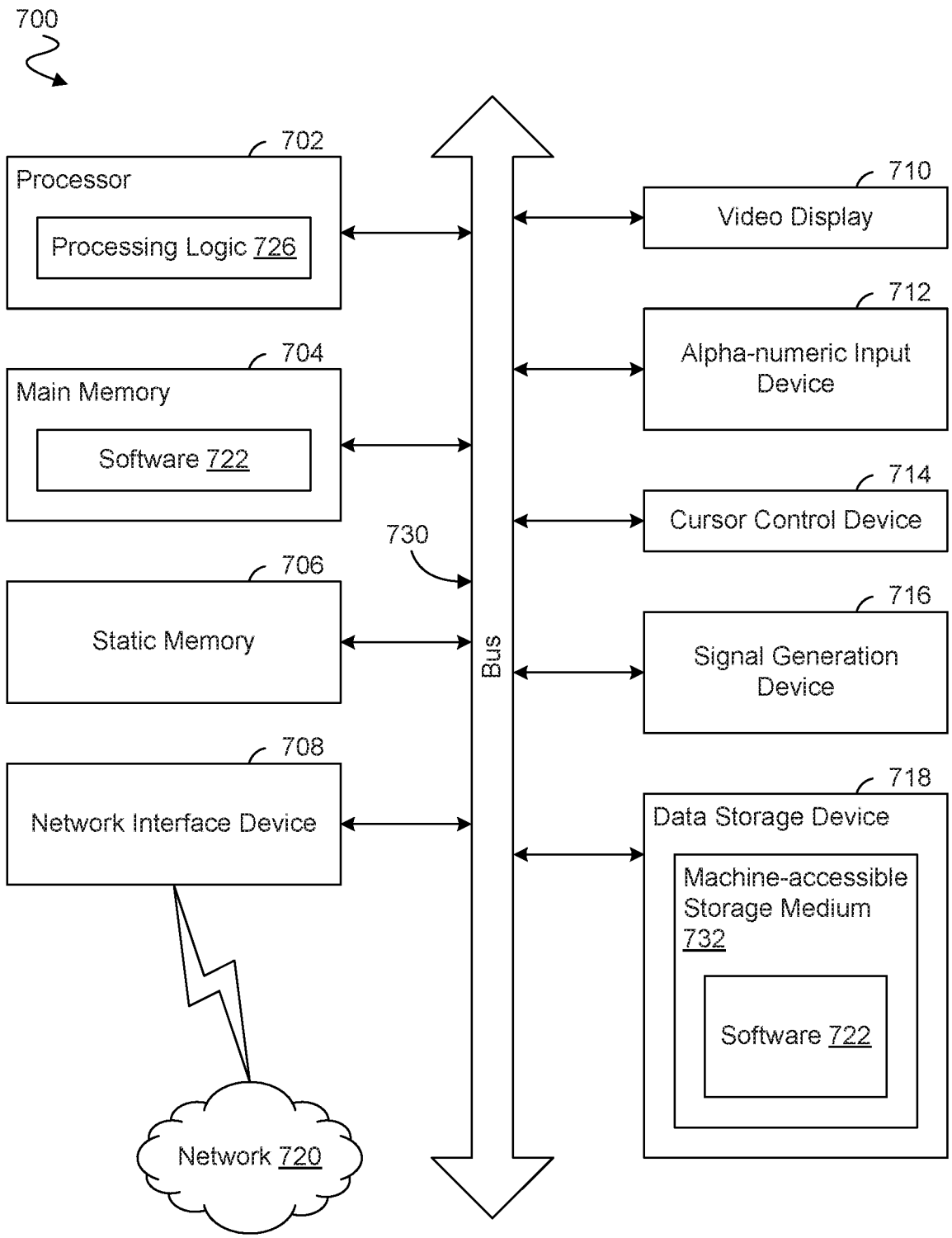
FIG. 7 is a functional block diagram illustrating elements of a computer system according to an embodiment.

FIG. 7 illustrates a diagrammatic representation of a machine in the exemplary form of a computer system 700 within which a set of instructions, for causing the machine to perform any one or more of the methodologies described herein, may be executed. Alternatively or in addition, computer system 700 may include IC structures to operate transistors which are arranged in a stacked configuration, as described herein. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 700 includes a processor 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a secondary memory 718 (e.g., a data storage device), which communicate with each other via a bus 730.

Processor 702 represents one or more general-purpose processing devices such as a microprocessor, central processing unit, or the like. More particularly, the processor 702 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 702 may also be one or more special-purpose processing devices such as an application specific integrated circuit (ASIC), a field programmable gate array (FPGA), a digital signal processor (DSP), network processor, or the like. Processor 702 is configured to execute the processing logic 726 for performing the operations described herein.

The computer system 700 may further include a network interface device 708. The computer system 700 also may include a video display unit 710 (e.g., a liquid crystal display (LCD), a light emitting diode display (LED), or a cathode ray tube (CRT)), an alphanumeric input device 712 (e.g., a keyboard), a cursor control device 714 (e.g., a mouse), and a signal generation device 716 (e.g., a speaker).

The secondary memory 718 may include a machine-accessible storage medium (or more specifically a computer-readable storage medium) 732 on which is stored one or more sets of instructions (e.g., software 722) embodying any one or more of the methodologies or functions described herein. The software 722 may also reside, completely or at least partially, within the main memory 704 and/or within the processor 702 during execution thereof by the computer system 700, the main memory 704 and the processor 702 also constituting machine-readable storage media. The software 722 may further be transmitted or received over a network 720 via the network interface device 708.

While the machine-accessible storage medium 732 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any of one or more embodiments. The term "machine-readable storage medium" shall accordingly be taken to include, but not be limited to, solid-state memories, and optical and magnetic media.

In one implementation, an integrated circuit (IC) device comprises a semiconductor substrate, and a first transistor coupled to the semiconductor substrate, the first transistor including a first channel structure, and a second transistor including a second channel structure, wherein the first transistor and the second transistor are arranged in a stacked configuration along a line of direction orthogonal to a surface of the semiconductor substrate. The IC device further comprises a first epitaxial structure coupled to the first channel structure at a first level relative to the surface of the semiconductor substrate, a second epitaxial structure coupled to the second channel structure at a second level relative to the surface of the semiconductor substrate, the first level offset from the second level, and a dielectric material disposed between the first epitaxial structure and the second epitaxial structure on a side of the stacked configuration.

In one embodiment, the first transistor further includes a first gate structure extending at least partially around the first channel structure. In another embodiment, the first gate structure extending completely around the first channel structure. In another embodiment, the second transistor further includes a second gate structure extending at least partially around the second channel structure. In another embodiment, the second gate structure extending around the second channel structure. In another embodiment, a complementary metal-oxide-semiconductor (CMOS) circuit include the first transistor and the second transistor. In another embodiment, the first transistor is a N-type metal-oxide-semiconductor (NMOS) transistor and the second transistor is a P-type metal-oxide-semiconductor (PMOS) transistor. In another embodiment, an inverter circuit includes the first transistor and the second transistor. In another embodiment, one of the first channel structure and the second channel structure includes a nanowire. In another embodiment, the IC device further comprises a via extending through the second epitaxial layer and to the first epitaxial layer.

In another implementation, a method comprises forming a first transistor coupled to a semiconductor substrate, forming a second transistor on the first transistor, wherein the first transistor and the second transistor are arranged in a stacked configuration along a line of direction orthogonal to a surface of the semiconductor substrate, and forming a second epitaxial structure coupled to the second channel structure at a second level relative to the surface of the semiconductor substrate, the first level offset from the second level. The method further comprises depositing a dielectric material on the first epitaxial structure, and forming a second epitaxial structure at a second location along the line of direction, the second epitaxial structure coupled to the second channel structure, wherein the dielectric material is disposed between the first epitaxial structure and the second epitaxial structure on a side of the stacked configuration.

In one embodiment, forming the first transistor includes forming a first gate structure which extends at least partially around the first channel structure. In another embodiment, the first gate structure extends completely around the first channel structure. In another embodiment, forming the second transistor includes forming a second gate structure which extends at least partially around the second channel structure. In another embodiment, the second gate structure extends completely the second channel structure. In another embodiment, a complementary metal-oxide-semiconductor (CMOS) circuit is formed at least in part by the forming the first transistor and the forming the second transistor. In another embodiment, the first transistor is a N-type metal-oxide-semiconductor (NMOS) transistor and the second transistor is a P-type metal-oxide-semiconductor (PMOS) transistor. In another embodiment, an inverter circuit is formed at least in part by the forming the first transistor and by the forming the second transistor. In another embodiment, one of the first channel structure and the second channel structure includes a nanowire. In another embodiment, the method further comprises forming a via extending through the second epitaxial layer and to the first epitaxial layer.

In another implementation, a system comprises an integrated circuit (IC) device including a semiconductor substrate, a first transistor coupled to the semiconductor substrate, the first transistor including a first channel structure, and a second transistor including a second channel structure, wherein the first transistor and the second transistor are arranged in a stacked configuration along a line of direction orthogonal to a surface of the semiconductor substrate. The IC device further comprises a first epitaxial structure coupled to the first channel structure at a first level relative to the surface of the semiconductor substrate, a second epitaxial structure coupled to the second channel structure at a second level relative to the surface of the semiconductor substrate, the first level offset from the second level, and a dielectric material disposed between the first epitaxial structure and the second epitaxial structure on a side of the stacked configuration. The system further comprises a display device coupled to the IC device, the display device to display an image based on a signal output by the IC device.

In one embodiment, the first transistor further includes a first gate structure extending at least partially around the first channel structure. In another embodiment, the first gate structure extending completely around the first channel structure. In another embodiment, the second transistor further includes a second gate structure extending at least partially around the second channel structure. In another embodiment, the second gate structure extending around the second channel structure. In another embodiment, a complementary metal-oxide-semiconductor (CMOS) circuit include the first transistor and the second transistor. In another embodiment, the first transistor is a N-type metal-oxide-semiconductor (NMOS) transistor and the second transistor is a P-type metal-oxide-semiconductor (PMOS) transistor. In another embodiment, an inverter circuit includes the first transistor and the second transistor. In another embodiment, one of the first channel structure and the second channel structure includes a nanowire. In another embodiment, the IC device further comprises a via extending through the second epitaxial layer and to the first epitaxial layer.

Techniques and architectures for operating integrated circuitry are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. An integrated circuit (IC) device comprising:
a semiconductor substrate;
a first transistor coupled to the semiconductor substrate, the first transistor including a first channel structure;
a second transistor including a second channel structure, wherein the first transistor and the second transistor are arranged in a stacked configuration along a line of direction orthogonal to a surface of the semiconductor substrate;
a first epitaxial structure coupled to the first channel structure at a first level relative to the surface of the semiconductor substrate;
a second epitaxial structure coupled to the second channel structure at a second level relative to the surface of the semiconductor substrate, the first level offset from the second level; and
a dielectric material disposed between the first epitaxial structure and the second epitaxial structure on a side of the stacked configuration, the dielectric material electrically isolating the first epitaxial structure from the second epitaxial structure.

2. The IC device of claim 1, the first transistor further including a first gate structure extending at least partially around the first channel structure.

3. The IC device of claim 2, the first gate structure extending completely around the first channel structure.

4. The IC device of claim 1, the second transistor further including a second gate structure extending at least partially around the second channel structure.

5. The IC device of claim 4, the second gate structure extending around the second channel structure.

6. The IC device of claim 1, wherein a complementary metal-oxide-semiconductor (CMOS) circuit include the first transistor and the second transistor.

7. The IC device of claim 6, wherein the first transistor is a N-type metal-oxide-semiconductor (NMOS) transistor and the second transistor is a P-type metal-oxide-semiconductor (PMOS) transistor.

8. The IC device of claim 1, wherein an inverter circuit includes the first transistor and the second transistor.

9. The IC device of claim 1, wherein one of the first channel structure and the second channel structure includes a nanowire.

10. The IC device of claim 1, further comprising a via extending through the second epitaxial layer and to the first epitaxial layer.

11. A system comprising:
an integrated circuit (IC) device including: a semiconductor substrate;
a first transistor coupled to the semiconductor substrate, the first transistor including a first channel structure;
a second transistor including a second channel structure, wherein the first transistor and the second transistor are arranged in a stacked configuration along a line of direction orthogonal to a surface of the semiconductor substrate;
a first epitaxial structure coupled to the first channel structure at a first level relative to the surface of the semiconductor substrate;
a second epitaxial structure coupled to the second channel structure at a second level relative to the surface of the semiconductor substrate, the first level offset from the second level; and
a dielectric material disposed between the first epitaxial structure and the second epitaxial structure on a side of the stacked configuration, the dielectric material electrically isolating the first epitaxial structure from the second epitaxial structure; and
a display device coupled to the IC device, the display device to display an image based on a signal output by the IC device.

12. The system of claim 11, the first transistor further including a first gate structure extending at least partially around the first channel structure.

13. The system of claim 12, the first gate structure extending completely around the first channel structure.

14. The system of claim 11, the second transistor further including a second gate structure extending at least partially around the second channel structure.

15. The system of claim 14, the second gate structure extending around the second channel structure.

* * * * *